(12) United States Patent
Wu et al.

(10) Patent No.: US 10,975,456 B2
(45) Date of Patent: Apr. 13, 2021

(54) THERMOELECTRIC ALLOY, METHOD FOR PRODUCING THE SAME AND THERMOELECTRIC ALLOY COMPOSITE

(71) Applicant: NATIONAL SUN YAT-SEN UNIVERSITY, Kaohsiung (TW)

(72) Inventors: Hsin-Jay Wu, Kaohsiung (TW); Wan-Ting Yen, Penghu County (TW); Pai-Chun Wei, New Taipei (TW); Yi-Fen Tsai, Taichung (TW)

(73) Assignee: NATIONAL SUN YAT-SEN UNIVERSITY, Kaohsiung (TW)

(*) Notice: Subject to any disclaimer, the term of this patent is extended or adjusted under 35 U.S.C. 154(b) by 236 days.

(21) Appl. No.: 16/234,535

(22) Filed: Dec. 27, 2018

(65) Prior Publication Data
US 2020/0123637 A1 Apr. 23, 2020

(30) Foreign Application Priority Data
Oct. 18, 2018 (TW) .................. 107136813

(51) Int. Cl.
*C22C 28/00* (2006.01)
*C22C 1/02* (2006.01)
*C22C 12/00* (2006.01)
*C30B 29/52* (2006.01)

(52) U.S. Cl.
CPC ............... *C22C 28/00* (2013.01); *C22C 1/02* (2013.01); *C22C 12/00* (2013.01); *C30B 29/52* (2013.01)

(58) Field of Classification Search
CPC .... C23C 8/78; C23C 8/20; C23C 8/44; C23C 8/58; C23C 8/34; C23C 8/64; C22C 28/00
See application file for complete search history.

(56) References Cited

U.S. PATENT DOCUMENTS

| | | | |
|---|---|---|---|
| 4,061,505 A | 12/1977 | Hampl, Jr. | |
| 6,043,424 A | 3/2000 | Horio et al. | |
| 2015/0020862 A1 | 1/2015 | Lee et al. | |

FOREIGN PATENT DOCUMENTS

| | | |
|---|---|---|
| JP | 2006222161 A | 8/2006 |
| TW | 201025687 A | 7/2010 |
| TW | 201118041 A | 6/2011 |
| TW | 201321524 A | 6/2013 |
| TW | 201444126 A | 11/2014 |
| WO | 2014143361 A1 | 9/2014 |

OTHER PUBLICATIONS

Jae-Shik Choi et al., "Thermoelectric Properties of n-Type (Pb1—xGex)Te Fabricated by Hot Pressing Method," 1997 IEEE, 16th International Conference on Thermoelectrics, pp. 228-231, (1997).

*Primary Examiner* — Jessee R Roe
(74) *Attorney, Agent, or Firm* — CKC & Partners Co., LLC

(57) ABSTRACT

The present invention relates to a thermoelectric alloy and a method for producing the same. A starting material is firstly provided, and an oxidation process is performed to the starting material to obtain an oxidized material composition. Then, the oxidized material composition and a carburizing agent are added into a quartz tube, and a sealing process is performed to the quartz tube. And then, the sealed quartz tube is subjected to a carburization process, thereby obtaining the thermoelectric alloy with excellent thermoelectric figure-of-merit.

7 Claims, 2 Drawing Sheets

THERMOELECTRIC ALLOY, METHOD FOR PRODUCING THE SAME AND THERMOELECTRIC ALLOY COMPOSITE

RELATED APPLICATIONS

This application claims priority to Taiwan Application Serial Number 107136813, filed Oct. 18, 2018, which is herein incorporated by reference in its entirety.

BACKGROUND

Field of Invention

The present invention relates to a thermoelectric alloy. More particularly, a thermoelectric alloy with high thermoelectric figure-of-merit and a method for producing the same are provided.

Description of Related Art

Thermal energy can be efficiently converted into electrical energy by thermoelectric materials. Thermoelectric phenomena of the thermoelectric materials can encompass separately conversion mechanisms: Seebeck effect, Peltier effect or Thomson effect. If two sides of a thermoelectric material exist a difference in temperature or voltage, there will be a relative voltage difference between both sides, or one side will be endothermic and the other side will be exothermic.

Accordingly, based on the aforementioned thermoelectric phenomena, the thermoelectric material can be typically applied in waste heat recovery for electricity production or a thermoelectric cooler.

Furthermore, thermoelectric efficiency of the thermoelectric material depends on its thermoelectric figure-of-merit, and the thermoelectric figure-of-merit is represented by following formula (I).

$$zT = \frac{S^2}{\kappa \rho} T \qquad (I)$$

In the formula (I), zT represents thermoelectric figure-of-merit, S represents Seebeck coefficient, $\rho$ represents electrical resistance value, $S^2/\rho$ represents power factor of the material, $\kappa$ represents thermal conductivity coefficient, and T is Kelvin temperature (K).

A thermoelectric material achieves better thermoelectric conversion efficiency for its higher thermoelectric figure-of-merit. However, the thermoelectric figure-of-merit of commercial thermoelectric materials is about 1.0, and the scope of their applications is restricted since such thermoelectric materials cannot replace compressors (the thermoelectric figure-of-merit is about 3.5) for dissipating heat.

In view of the above, there is a need to provide a thermoelectric alloy and a method for producing the same, so as to improve the disadvantages of the conventional thermoelectric materials.

SUMMARY

Therefore, an aspect of the present invention provides a method for producing a thermoelectric alloy. A carburizing agent decomposes on heating to generate active carbon atoms during a carburization process, and the active carbon atoms can diffuse into an as-melted thermoelectric alloy material, thereby improving thermoelectric properties of the thermoelectric alloy.

Another aspect of the present invention provides a thermoelectric alloy produced by the aforementioned method.

A further aspect of the present invention provides a thermoelectric alloy composite including the aforementioned thermoelectric alloy.

According to the aforementioned aspect, a method for producing a thermoelectric alloy is provided. A starting material is provided and subjected to an oxidation process for producing an oxidized material composition. Based on the oxidized material composition as 100 atom percent (at %), an oxygen content of the oxidized material composition is 0.001 at % to 10 at %. Next, the oxidized material composition and a carburizing agent are added into a quartz tube, and the quartz tube is subjected to a sealing process to obtain a sealed quartz tube. Then, a carburization process is performed to the sealed quartz tube, thereby producing the thermoelectric alloy.

According to one embodiment of the present invention, the starting material includes germanium (Ge), tellurium (Te), bismuth (Bi), zinc (Zn), antimony (Sb), selenium (Se), copper (Cu), indium (In), gallium (Ga), silver (Ag), cobalt (Co), iron (Fe) and/or lead (Pb).

According to another embodiment of the present invention, the carburizing agent in a form of a solid, a liquid, a gas and/or a plasma.

According to yet another embodiment of the present invention, the operation of adding the oxidized material composition and the carburizing agent into the quartz tube comprises performing a carbon coating process by the carburizing agent, so as to form a carbon film on an inner surface of the quartz tube and adding the oxidized material composition into the quartz tube having the carbon film.

According to yet another embodiment of the present invention, a vacuum degree of the sealed quartz tube is not larger than 0.03 mbar.

According to yet another embodiment of the present invention, the carburization process includes a heating step, and the heating step is heated from 200° C. to a melting point of the starting material.

According to yet another embodiment of the present invention, a cooling rate of the carburization process is 2° C./hour to 10° C./hour.

According to yet another embodiment of the present invention, after the carburization process is performed, the thermoelectric alloy is further subjected to a crystal growth process.

According to the aforementioned aspect, a thermoelectric alloy is provided. Based on the thermoelectric alloy as 100 wt %, a carbon content of the thermoelectric alloy is 0.005 wt % to 0.05 wt %.

According to one embodiment of the present invention, the thermoelectric alloy includes P-type thermoelectric alloy and N-type thermoelectric alloy.

According to the aforementioned aspect, a thermoelectric alloy composite is provided. Based on an amount of the thermoelectric alloy composite as 100 wt %, an amount of the thermoelectric alloy is at least 10 wt %.

In the thermoelectric alloy and the method for producing the same of the present invention, the carburizing agent is subjected to the carburization process to decompose to generate active carbon atoms, thereby promoting the active carbon atoms to diffuse into the as-melted oxidized material composition, thereby improving thermoelectric properties of the thermoelectric alloy.

BRIEF DESCRIPTION OF THE DRAWINGS

The invention can be more fully understood by reading the following detailed description of the embodiment, with reference made to the accompanying drawings as follows.

DETAILED DESCRIPTION

In the following description, several specific details are presented to provide a thorough understanding of the device structures according to embodiments of the present invention. One skilled in the relevant art will recognize, however, that the embodiments of the present invention provide many applicable inventive concepts which can be practiced in various specific contents. The specific embodiments discussed hereinafter are used for explaining but not limiting the scope of the present invention.

Generally, when a content of impurity elements of a thermoelectric alloy is less, an electrical resistance value of the thermoelectric alloy is lower, such that the thermoelectric alloy has higher thermoelectric figure-of-merit and better thermoelectric properties. Therefore, in order to lower the effects of the impurity elements on the thermoelectric properties, starting materials of the thermoelectric alloy all are high purity materials or those subjected to purifying processes for removing the impurity elements therein. For example, as an increasing of an oxygen content of the thermoelectric alloy, the electrical resistance value of the thermoelectric alloy increases, thereby lowering the thermoelectric properties of the thermoelectric alloy. Accordingly, it is strict with purities of the starting materials. Further, it is necessary to stock the starting materials well to prevent the starting materials from being oxidized during storage. However, the thermoelectric figure-of-merit of the thermoelectric alloy does not be outstandingly improved.

Accordingly, the present invention is firstly subjected the starting materials of the thermoelectric alloy to be oxidized to increase an oxygen content of the starting materials, and then subjecting to a carburization process, thereby increasing a content of carbon diffused in the thermoelectric alloy by reducing the oxidized starting materials, so as to lower thermal conductivity coefficient and increase power factor thereof. Therefore, the thermoelectric properties of the thermoelectric alloy of the present invention can be efficiently enhanced.

Figure 1:
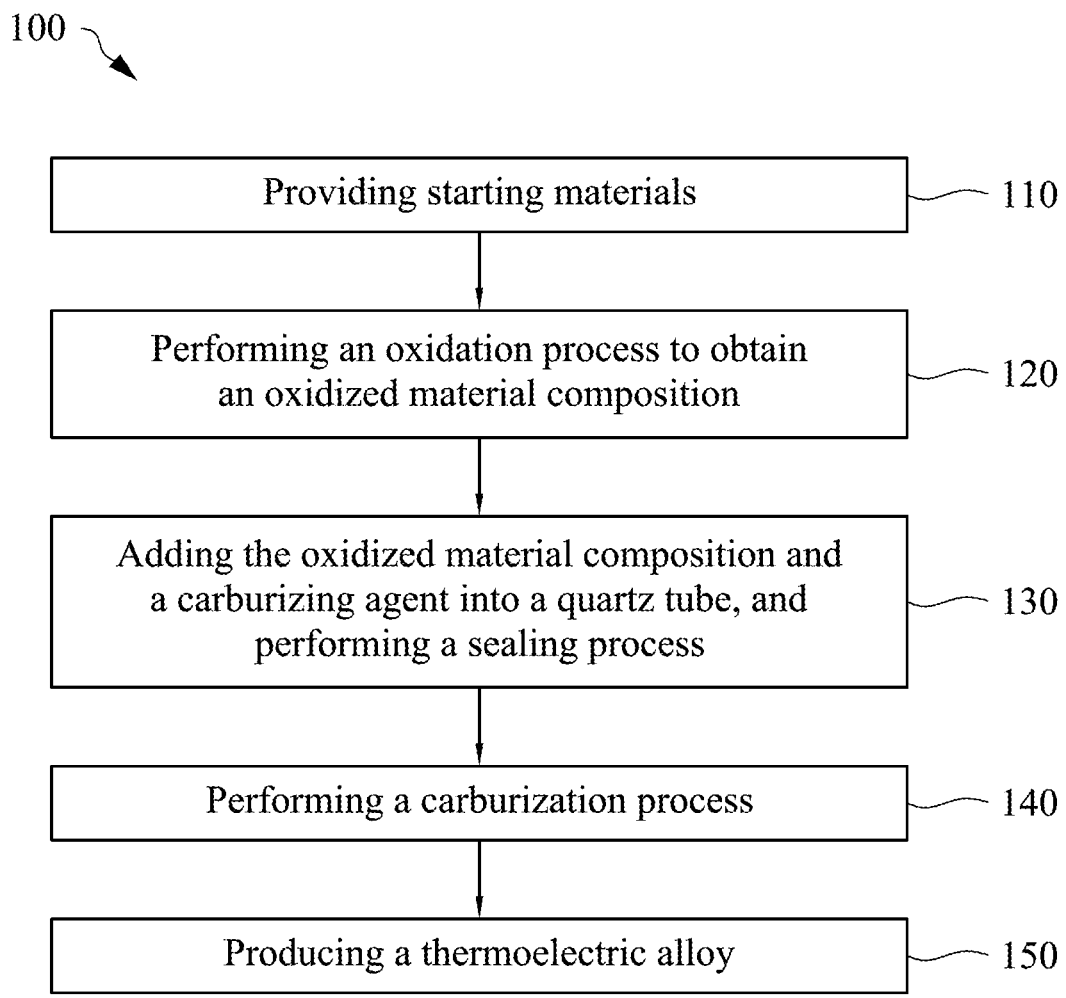
FIG. 1 is a flow chart showing a method for producing a thermoelectric alloy in accordance with some embodiments of the present invention.

Referring to FIG. 1. FIG. 1 is a flow chart showing a method for producing a thermoelectric alloy in accordance with some embodiments of the present invention. In the method 100, starting materials are firstly provided, and the starting materials are subjected to an oxidation process, so as to produce an oxidized material composition, shown as operation 110 and operation 120. Based on chemical compositions of the thermoelectric alloy, the starting materials have corresponding compositions and ratios. In some embodiments, the starting materials are a mixture. In those embodiments, the mixture can include metallic materials and/or non-metallic materials. In some embodiments, the starting materials can include but be not limited to germanium (Ge), tellurium (Te), bismuth (Bi), zinc (Zn), antimony (Sb), selenium (Se), copper (Cu), indium (In), gallium (Ga), silver (Ag), cobalt (Co), iron (Fe), lead (Pb), other suitable thermoelectric materials, or a combination thereof. In some embodiments, purities of each compounds of the starting materials preferably is not lower than 4N for producing the thermoelectric alloy with excellent properties.

Based on the oxidized material composition produced by operation 120 as 100 atom percent (at %), an oxygen content of the oxidized material composition can be 0.001 at % to 10 at %. In some embodiments, the oxygen content of the oxidized material composition preferably can be 1 at % to 6 at %, and more preferably is 2 at % to 5 at %.

Then, the oxidized material composition and a carburizing agent are added into a quartz tube, and the quartz tube is subjected to a sealing process to form a sealed quartz tube, shown as operation 130. In some embodiments, there are no limitations for the carburizing agent, but it is necessary to be as a carbon source during sequential carburization process. In some embodiments, major compositions of the carburizing agent are carbon atoms, and preferably the carburizing agent does not include other impurity elements, such that the compositions of the thermoelectric alloy can satisfy requirements. In some embodiments, the carburizing agent can include but be not limited to a solid carbon source, a liquid carbon source, a gaseous carbon source, a plasma carbon source, other suitable carbon sources, or a combination thereof. For example, the carburizing agent can include but be not limited to carbon powder, a graphite powder, graphene, diamonds, carbon nanotube, amorphous carbons, fullerenes, other suitable materials, or a combination thereof.

In some embodiments, the carburizing agent and the oxidized material composition can be simultaneously added into the quartz tube. In other embodiments, the carburizing agent can be formed in or added into the quartz tube before the oxidized material composition is added. For example, the quartz tube can firstly be subjected to a carbon coating process to form the carburizing agent on an inner surface of the quartz tube, thereby obtain a quartz tube with a carbon film on the inner surface thereof. Then, the oxidized material composition can be added into the quartz tube with the carbon film to be subjected to a sequential sealing process.

When the sealing process is performed, air in the quartz tube is discharged by vacuum pump, and a tube orifice of the quartz tube is sealed by an oxy-gas burning torch to seal the quartz tube. A vacuum degree of the sealed quartz tube is not larger than 0.03 mbar.

After the sealing process is performed, a carburization process is performed to the sealed quartz tube, thereby obtaining the thermoelectric alloy of the present invention, shown as operation 140 and operation 150. When the carburization process is performed, the carburizing agent (or carbon atoms) in the sealed quartz tube can be reduced to be as the oxidized material composition, and active carbon atoms can diffuse into an as-melted oxidized material composition during the carburization process, thereby enhancing properties of the thermoelectric alloy. In some embodiments, based on the thermoelectric alloy as 100 wt %, a carbon content of the thermoelectric alloy can be 0.005 wt % to 0.05 wt %. In some embodiments, the thermoelectric alloy preferably does not include oxygen atoms. If the thermoelectric alloy includes oxygen atoms, the electrical resistance value of the thermoelectric alloy will be increased so as to decrease the thermoelectric figure-of-merit thereof.

The carburization process further includes a heating step to promote the carburizing agent to decompose to generate the active carbon atoms and further to subject the active carbon atoms to efficiently be diffused into the thermoelectric alloy. The heating step is heated from 200° C. to a melting point of the aforementioned starting materials, such that the oxidized material composition is melted and the carbon atoms can diffuse into the oxidized material composition. Preferably, compounds of the oxidized material composition all are melted during the heating step. In other words, when the oxidized material composition is heated to a setting temperature, all compounds of the oxidized material composition are melted. In some embodiments, the heating step preferably is heated from 200° C. to 1100° C., and more preferably is from 200° C. to 950° C. In some embodiments, when the carburization process is performed, a furnace is firstly heated from room temperature to 200° C., and then the sealed quartz tube is placed into the furnace (200° C.). In some embodiments, during a heating stage of the carburization process, carbon atoms can diffuse into the oxidized material composition to reduce the oxidized material composition. Next, the as-reduced oxidized material composition can be melted to form a thermoelectric alloy liquid. In some embodiments, during the heating stage of the carburization process, the oxidized material composition can melted to form an oxidized material composition liquid, the carbon atoms diffuse into the oxidized material composition liquid to reduce the oxidized material composition liquid. And then, the as-reduced oxidized material composition is formed into the thermoelectric alloy. In some embodiments, during the heating stage of the carburization process, the oxidized material composition can firstly be melted and formed into the thermoelectric alloy liquid. Then, the carbon atoms can diffuse into the thermoelectric alloy liquid and reduce oxygen atoms in the thermoelectric alloy liquid.

In the carburization process, if the oxygen content of the oxidized material composition is less than 0.001 at %, it will be hard for the thermally decomposed active carbon atoms to diffuse into the thermoelectric alloy because an oxidized degree of the oxidized material composition is too low, thereby decreasing the content of carbon atoms in the thermoelectric alloy and lowering thermoelectric properties of the thermoelectric alloy. If the oxygen content of the oxidized material composition was more than 10 at %, a portion of the oxidized material would not be reduced, such that the thermoelectric material would still include oxygen atoms, thereby enhancing the electrical resistance value of the thermoelectric material and lowering the thermoelectric properties thereof.

Besides, in the carburization process, when a vacuum degree of the sealed quartz tube is not larger than 0.03 mbar, an interior of the sealed quartz tube is an anoxic environment. Thus, the oxidized material composition can be more efficiently reduced by the active carbon atoms produced by the carburization process, and the active carbon atoms can efficiently diffuse into the as-melted oxidized material composition without being affected by oxygen atoms in the environment, thereby decreasing a thermal conductivity coefficient and increasing power factor of the thermoelectric alloy. Therefore, the thermoelectric alloy has excellent thermoelectric properties.

After the high temperature carburization process is performed, a cooling rate of the carburization process can be 2° C./hour to 10° C./hour. When the cooling rate falls in the aforementioned range, the as-melted and as-reduced oxidized material composition can be cooled slowly so as to be equipped with more compact structure and better crystal properties, thereby improving properties of the thermoelectric alloy. In some embodiments, the cooling rate of the carburization process preferably can be 3° C./hour to 8° C./hour, and more preferably is 5° C./hour to 7° C./hour.

After the aforementioned carburization process is performed, the thermoelectric alloy produced by the aforementioned method of the present invention can be selectively subjected to a crystal growth process, thereby improving the crystal properties of the thermoelectric alloy. Therefore, the thermoelectric properties of the bulk thermoelectric alloy produced by the crystal growth process are improved.

In on example, based on amounts and compositions of the starting materials, the thermoelectric alloy produced by the aforementioned method can be P-type thermoelectric alloy and N-type thermoelectric alloy.

In some examples, the thermoelectric alloy has a composition of $M1_{x1}(B1_{y1}C1_{z1})$. M1 represents a doped metallic element, and M1 can be Li, Na, K, Rb, Cs, Be, Mg, Ca, Sr, Ba, Cu, Ag, Au, Zn, Mn, Fe, Co, Ni, La, Ce, Pr, Nd, Yb, other suitable elements, or a combination thereof. B1 can be Al, Ga, In, Sb, Bi, other suitable elements, or a combination thereof. C1 can be O, S, Se, Te, F, Cl, Br, I, other suitable elements, or a combination thereof. x1 represents a number lager than 0 and smaller than 1. y1 represents a number larger than 1.5 and smaller than 2.5. z1 represents a number larger than 2.3 and smaller than 3.7. For example, the thermoelectric alloy can be $Bi_2Te_3$ doped with M1.

In some examples, the thermoelectric alloy has a composition of $M2_{x2}(B2_{y2}C2_{z2})$. M2 represents a doped metallic element, and M2 can be Li, Na, K, Rb, Sr, Mg, Ca, Sr, Ba, Cu, Ag, Au, Zn, Al, Ga, In, As, Sb, Bi, Br, I, other suitable elements, or a combination thereof. B2 can be Si, Ge, Sn, Pb, other suitable elements, or a combination thereof. C2 can be N, P, As, Sb, Bi, Te, other suitable elements, or a combination thereof. x2 represent a number lager than 0.02 and smaller then 0.2. y2 represents a number larger than 0.7 and smaller than 1.3. z2 represent a number larger than 0.7 and smaller than 1.3. For example, the thermoelectric alloy can be PbTe or GeTe doped with M2.

In some examples, the thermoelectric alloy has a composition of $M3_{x3}(B3_{y3}C3_{z3})$. M3 represents a doped metallic element, and M3 can be Li, Na, K, Cs, Mg, Ca, Sr, Ba, Cu, Ag, Au, Zn, La, Ce, Mn, Fe, Co, Ni, other suitable elements, or a combination thereof. B3 can be Al, Ga, In, Zn, Cd, other suitable elements, or a combination thereof. C3 can be N, P, As, Sb, Bi, Se, other suitable elements, or a combination thereof. x3 represents a number larger than 0 and smaller than 0.5. y3 represents a number larger than 2.7 and smaller than 4.4. z3 represents a number larger than 2.5 and smaller than 3.5. For example, the thermoelectric alloy can be ZnSb, $Zn_4Sb_3$, $In_4Se_3$ or InSb doped with M3.

In some examples, the thermoelectric alloy has a composition of $M4_{x4}(B4_{y4}C4_{z4})$. M4 represents a doped metallic element, and M4 can be Li, Cs, Rb, Ba, Ga, In, Tl, La, Ce, Pr, Nd, Yb, other suitable elements, or a combination thereof. B4 can be Fe, Co, Ni, Ru, Rh, Pd, other suitable elements, or a combination thereof. C4 can be As, Sb, other suitable elements, or a combination thereof. x4 represents a number larger than 0 and smaller than 0.4. y4 represents a number larger than 0.7 and smaller than 1.3. z4 represents a number larger than 2.5 and smaller than 3.5. For example, the thermoelectric alloy can be $FeCoSb_3$ doped with M4.

In some examples, the thermoelectric alloy has a composition of $M5_{x5}(A5_{p5}B5_{y5}C5_{z5})$. M5 represents a doped metallic element, and M5 can be Li, Na, K, Cs, Cl, Br, I, other suitable elements, or a combination thereof. A5 can be Cu, Ag, Au, other suitable elements, or a combination thereof. B5 can be Ga, In, Ge, Sn, As, Sb, Bi, other suitable elements, or a combination thereof. C5 can be S, Se, Te, other suitable elements, or a combination thereof. x5 represents a number larger than 0 and smaller than 0.2. p5 represents a number larger than 0.7 and smaller than 1.3. y5 represents a number larger than 0.7 and smaller than 1.3. z5 represents a number larger than 1.7 and smaller than 2.3. For example, the thermoelectric alloy can be $AgSbTe_2$ or $CuInSe_2$ doped with M5.

In some examples, the thermoelectric alloy of the present invention can be mixed with other conventional thermoelectric alloys to form a thermoelectric alloy composite, such that the thermoelectric alloy composite has excellent thermoelectric figure-of-merit. Based on the thermoelectric alloy composite as 100 wt %, a content of the thermoelectric alloy of the present invention is at least 10 wt %, preferably is 10 wt % to 80 wt %, and more preferably is 50 wt % to 60 wt %.

Because the thermally decomposed active carbon atoms can diffuse into the as-melted oxidized material composition during the aforementioned carburization process, the thermal conductivity coefficient of the thermoelectric alloy can be decreased or the power factor thereof can be enhanced. Therefore, the thermoelectric alloy has better thermoelectric properties.

Several embodiments are described below to illustrate the application of the present invention. However, these embodiments are not intended to limit the scope the present invention. For those skilled in the art of the present invention, various variations and modifications can be made without departing from the spirit and scope of the present invention.

Producing Thermoelectric Alloy

Embodiment 1

Copper metals (Cu), bismuth metals (Bi) and tellurium metals (Te) with purity equal to or higher than 4N were firstly provided, and those metals were subjected to an oxidation process to obtain an oxidized material composition including copper oxide, bismuth oxide and tellurium dioxide. An oxygen content of the oxidized material composition was 4 at %. Next, a carbon coating process was performed to form a carbon film on an inner surface of a quartz tube. Then, the aforementioned oxidized material composition was added into the quartz tube with the carbon film on the inner surface, and air in the quartz tube was discharged by vacuum pump to decrease a vacuum degree of the quartz tube.

When the vacuum degree of the quartz tube was not larger than 0.03 mbar, a sealing process was performed to the quartz tube to seal a tube orifice of the quartz tube. And then, the sealed quartz tube was heated with a heating rate of 2° C./minute to 5° C./minute until a temperature of the sealed quartz tube was 950° C. Therefore, active carbon atoms were produced by heating the carbon film, so as to be subjected to a carburization process.

After materials in the sealed quartz tube were homogenized, the sealed quartz tube was cooled to room temperature. The solidified materials were placed into a crystal growth furnace (a crystal growth rate is 4° C./hour), thereby producing the thermoelectric alloy of Embodiment 1. The thermoelectric alloy was evaluated according to the following evaluation method of thermoelectric figure-of-merit, and the result thereof was described as follows.

Embodiment 2

Stibium metals (Sb), germanium metals (Ge) and tellurium metals (Te) with purity equal to or higher than 4N were firstly provided, and those metals were subjected to an oxidation process to obtain an oxidized material composition including stibium oxide, germanium oxide and tellurium dioxide. An oxygen content of the oxidized material composition was 10 at %. Next, a carbon coating process was performed to form a carbon film on an inner surface of a quartz tube. Then, the aforementioned oxidized material composition was added into the quartz tube with the carbon film on the inner surface, and air in the quartz tube was discharged by vacuum pump to decrease a vacuum degree of the quartz tube.

When the vacuum degree of the quartz tube was not larger than 0.03 mbar, a sealing process was performed to the quartz tube to seal a tube orifice of the quartz tube. And then, the sealed quartz tube was heated with a heating rate of 2° C./minute to 5° C./minute until a temperature of the sealed quartz tube was 950° C. Therefore, active carbon atoms were produced by heating the carbon film, so as to be subjected to a carburization process.

After materials in the sealed quartz tube were homogenized, the sealed quartz tube was cooled to room temperature with a cooling rate of 5° C./hour to 10° C./hour, thereby producing the thermoelectric alloy of Embodiment 2. The thermoelectric alloy was evaluated according to the following evaluation method of thermoelectric figure-of-merit, and the result thereof was described as follows.

Comparative Embodiment 1

Comparative Embodiment 1 was practiced with the same compositions and amounts of the starting materials as in Embodiment 1, but the difference therebetween resides in that the starting materials of Comparative Embodiment 1 were placed into a quartz tube and subjected to the sealing process rather than being subjected to the oxidation process of Embodiment 1.

Then, the sealed quartz tube was subjected to a melting process. After the materials in the quartz tube were homogenized, the sealed quartz tube was cooled to room temperature. The solidified materials were placed into a crystal growth furnace (a crystal growth rate is 4° C./hour), thereby producing the thermoelectric alloy of Comparative Embodiment 1. The thermoelectric alloy was evaluated according to the following evaluation method of thermoelectric figure-of-merit, and the result thereof was described as follows.

Comparative Embodiment 2

Comparative Embodiment 2 was practiced with the same compositions and amounts of the starting materials as in Embodiment 2, but the difference therebetween resides in that the starting materials of Comparative Embodiment 2 were placed into a quartz tube and subjected to the sealing process rather than being subjected to the oxidation process of Embodiment 2.

Then, the sealed quartz tube was subjected to a melting process. After the materials in the quartz tube were homogenized, the sealed quartz tube was cooled to room temperature with a cooling rate of 5° C./hour to 10° C./hour, thereby producing the thermoelectric alloy of Comparative Embodiment 2. The thermoelectric alloy was evaluated according to the following evaluation method of thermoelectric figure-of-merit, and the result thereof was described as follows.

Evaluation Methods

Thermoelectric Figure-of-Merit

The electrical resistance value (ρ) and Seebeck coefficient (S) of the thermoelectric alloy produced by Embodiments 1 to 2 and Comparative Embodiments 1 to 2 were respectively measured by a temperature-dependent measurement system (manufactured by ULVAC-RIKO, and the model is ZEM-3). In the measurement system, a testing sample of the thermoelectric alloy was fixed by two nickel electrodes, and two thermal couples were disposed to measure temperature difference of the testing sample. The temperature difference was 7K, 10K, 13K or 16K. Then, a pressure of a measurement chamber was lowered to $10^{-2}$ torr, and an inert gas with a purity of 6N was introduced. After the aforementioned procedures were repeated several times, a mirror amount of a high purity helium gas was introduced to prevent the testing sample from oxidation reaction at high temperature. And then, a testing voltage was a fixed value, and an electrical current (a maximum value of the current was 130 mA) was adjusted by an electrical resistance value of the testing sample, thereby calculating the electrical resistance value (ρ) and Seebeck coefficient (S) by computer software.

Next, a thermal conductivity coefficient (κ) of the thermoelectric alloy was measured by a thermal diffusivity and conductivity laser flash apparatus (LFA, manufactured by Netzsch, and the model is LFA 457). In the LFA, a side of the testing sample of the thermoelectric alloy was heated by laser light, and a temperature of an opposite side of the testing sample was measured by an infrared sensor (or a thermal couple), such that a temperature variation of the testing sample in a period of time can be detected. The testing sample of the thermoelectric alloy is a round sample with a diameter of 7 mm and a thickness of 1.5 mm to 2 mm. Then, the thermal conductivity coefficient (κ) of the thermoelectric alloy of Embodiments 1 to 2 and Comparative Embodiments 1 to 2 was calculated according to the following formula (II).

$$\kappa = DC_p d \quad (II)$$

In the formula (II), D represents the temperature variation, $C_p$ represents a specific heat of the testing sample $$\left(C_p = \frac{3R}{M},\right.$$

R is 8.314 J/g-mol*K, and M is molecule weight), and d represents a density of the testing sample.

Based on the electrical resistance value (ρ), Seebeck coefficient (S) and thermal conductivity coefficient (κ), the thermoelectric figure-of-merit of the thermoelectric alloy of Embodiments 1 to 2 and Comparative Embodiments 1 to 2 at different temperature was calculated according to the aforementioned formula (I).

Figure 2A:
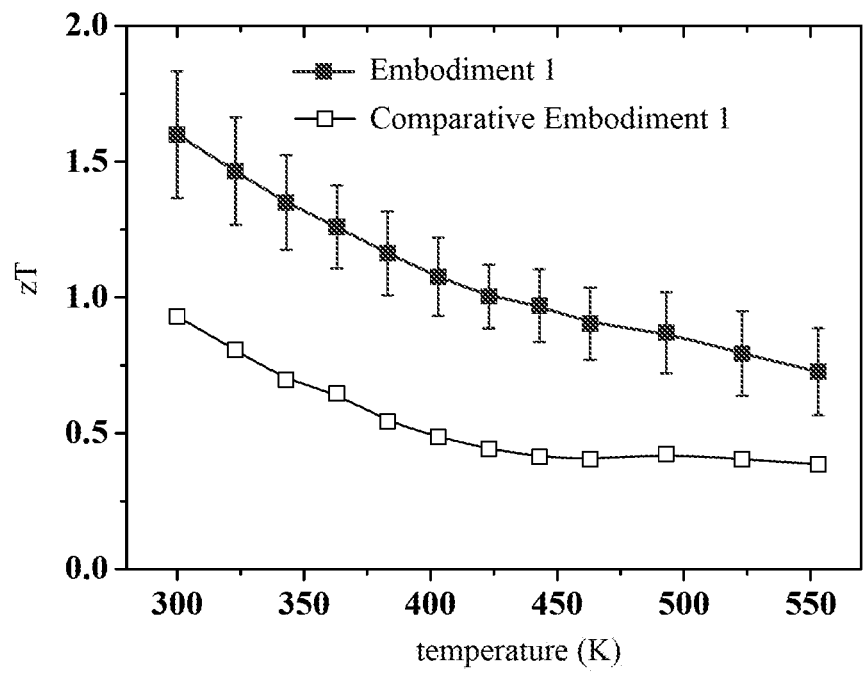
FIG. 2A is a broken line graph of the thermoelectric figure-of-merit (zT) of the thermoelectric alloy at different temperatures in accordance with Embodiment 1 and Comparative Embodiment 1 of the present invention.
Figure 2B:
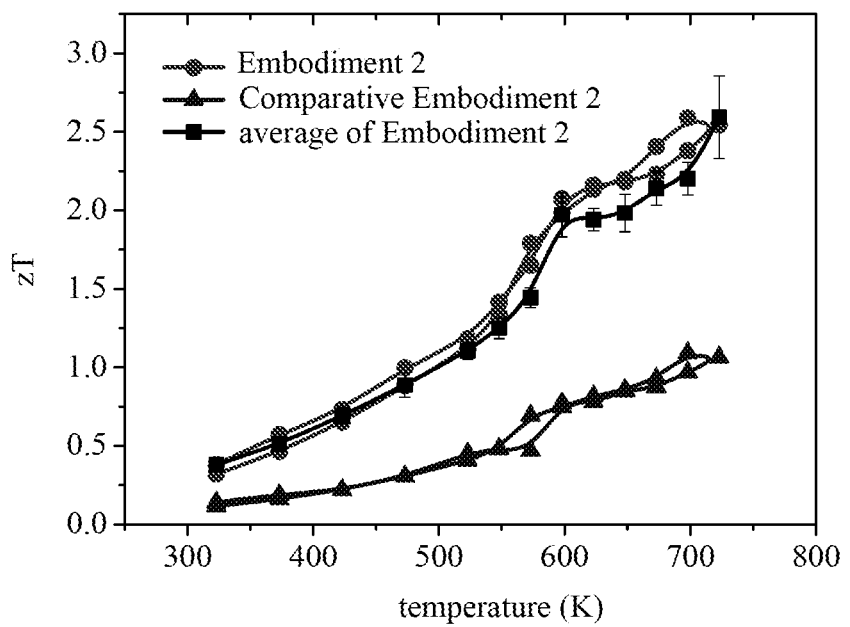
FIG. 2B is a broken line graph of the thermoelectric figure-of-merit (zT) of the thermoelectric alloy at different temperatures in accordance with Embodiment 2 and Comparative Embodiment 2 of the present invention.

Referring to FIG. 2A and FIG. 2B. FIG. 2A is a broken line graph of the thermoelectric figure-of-merit (zT) of the thermoelectric alloy at different temperatures in accordance with Embodiment 1 and Comparative Embodiment 1 of the present invention, and FIG. 2B is a broken line graph of the thermoelectric figure-of-merit (zT) of the thermoelectric alloy at different temperatures in accordance with Embodiment 2 and Comparative Embodiment 2 of the present invention.

As shown in FIG. 2A, the thermoelectric figure-of-merit (zT) of the thermoelectric alloy of Embodiment 1 at 300K (26.85° C.) is 1.7, and the thermoelectric figure-of-merit of the thermoelectric alloy of Comparative Embodiment 1 at 300K (26.85° C.) is 1.2. Moreover, at different temperatures, the thermoelectric alloy of Embodiment 1 has higher thermoelectric figure-of-merit.

Besides, the thermoelectric figure-of-merit of the thermoelectric alloy of Embodiment 1 at 300K is twice as high as that of a commercial thermoelectric alloy (N-type TeSe doped with Bi, and the thermoelectric figure-of-merit thereof is 0.85 to 1.04).

As shown in FIG. 2B, the thermoelectric figure-of-merit of the thermoelectric alloy of Embodiment 2 at 723K (449.85° C.) is 2.5, and the thermoelectric figure-of-merit of the thermoelectric alloy of Comparative Embodiment 2 at 300K (449.85° C.) is 1.0. Similarly, at different temperatures, comparing with the thermoelectric alloy of Comparative Embodiment 2, the thermoelectric alloy of Embodiment 1 has higher thermoelectric figure-of-merit.

Therefore, based on the evaluation results of Embodiments 1 to 2 and Comparative Embodiments 1 to 2, the method of the present invention subjects the starting materials to be oxidized by the oxidation process. The oxidized starting materials can be reduced by the active carbon atoms produced by the sequential carburization process, and the active carbon atoms diffuse into the as-melted oxidized material composition, such that the thermal conductivity coefficient of the thermoelectric alloy is decreased and the power factor thereof is increased. Thus, the thermoelectric properties of the thermoelectric alloy are improved.

As is understood by a person skilled in the art, the foregoing embodiments of the present invention are illustrative of the present invention rather than limiting the scope of the present invention. It is intended to cover various modifications and similar arrangements included within the spirit and scope of the appended claims, the scope of which should be accorded with the broadest interpretation so as to encompass all such modifications and similar structures.

What is claimed is:

1. A method for producing a thermoelectric alloy, comprising:
    providing a starting material, wherein the starting material includes germanium (Ge), tellurium (Te), bismuth (Bi), zinc (Zn), antimony (Sb), selenium (Se), copper (Cu), indium (In), gallium (Ga), silver (Ag), cobalt (Co), iron (Fe) and/or lead (Pb);
    performing an oxidation process to the starting material for producing an oxidized material composition, wherein based on the oxidized material composition as 100 atom percent (at %), an oxygen content of the oxidized material composition is 0.001 at % to 10 at %;
    adding the oxidized material composition and a carburizing agent into a quartz tube, and performing a sealing process, so as to form a sealed quartz tube; and
    performing a carburization process to the sealed quartz tube, thereby producing the thermoelectric alloy.

2. The method for producing the thermoelectric alloy of claim 1, wherein the carburizing agent is in a form of a solid, a liquid, a gas and/or a plasma.

3. The method for producing the thermoelectric alloy of claim 1, wherein the operation of adding the oxidized material composition and the carburizing agent into the quartz tube comprises:
    adding the carburizing agent into the quartz tube and performing a carbon coating process, so as to form a carbon film on an inner surface of the quartz tube; and
    adding the oxidized material composition into the quartz tube having the carbon film.

4. The method for producing the thermoelectric alloy of claim 1, wherein a vacuum degree of the sealed quartz tube is not larger than 0.03 mbar.

5. The method for producing the thermoelectric alloy of claim 1, wherein the carburization process includes a heating step, and the heating step is heated from 200° C. to a melting point of the starting material.

6. The method for producing the thermoelectric alloy of claim 5, wherein a cooling rate of the carburization process is 2° C./hour to 10° C./hour.

7. The method for producing the thermoelectric alloy of claim 1, after performing the carburization process, further comprising:

performing a crystal growth process to the thermoelectric alloy.

* * * * *